(12) United States Patent
Ramaswamy et al.

(10) Patent No.: US 10,811,751 B2
(45) Date of Patent: Oct. 20, 2020

(54) MONOLITHIC SPLITTER USING RE-ENTRANT POLY SILICON WAVEGUIDES

(71) Applicant: Intel Corporation, Santa Clara, CA (US)

(72) Inventors: Rahul Ramaswamy, Hillsboro, OR (US); Chia-Hong Jan, Portland, OR (US); Walid Hafez, Portland, OR (US); Neville Dias, Hillsboro, OR (US); Hsu-Yu Chang, Hillsboro, OR (US); Roman Olac-Vaw, Hillsboro, OR (US); Chen-Guan Lee, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/461,554

(22) PCT Filed: Dec. 30, 2016

(86) PCT No.: PCT/US2016/069533
§ 371 (c)(1),
(2) Date: May 16, 2019

(87) PCT Pub. No.: WO2018/125224
PCT Pub. Date: Jul. 5, 2018

(65) Prior Publication Data
US 2019/0356032 A1  Nov. 21, 2019

(51) Int. Cl.
*H01P 3/12* (2006.01)
*H01L 21/768* (2006.01)
(Continued)

(52) U.S. Cl.
CPC ........ *H01P 3/121* (2013.01); *H01L 21/76877* (2013.01); *H01L 21/823475* (2013.01);
(Continued)

(58) Field of Classification Search
CPC .......... H01P 3/121; H01P 3/122; H01P 3/127; H01P 5/12; H01P 11/002; H01P 3/165;
(Continued)

(56) References Cited

U.S. PATENT DOCUMENTS 7,138,308 B2 * 11/2006 Cheng ............... H01L 29/66545
438/197
2011/0142392 A1   6/2011 Tilly
(Continued)

OTHER PUBLICATIONS

International Preliminary Report on Patentability for International Patent Application No. PCT/US2016/069543 dated Jul. 11, 2019, 7 pgs.
(Continued)

*Primary Examiner* — Robert J Pascal
*Assistant Examiner* — Kimberly E Glenn
(74) *Attorney, Agent, or Firm* — Schwabe, Williamson & Wyatt, P.C.

(57) ABSTRACT

Embodiments of the invention include an electromagnetic waveguide and methods of forming the electromagnetic waveguide. In an embodiment the electromagnetic waveguide includes a first spacer and a second spacer. In an embodiment, the first and second spacer each have a reentrant profile. The electromagnetic waveguide may also include a conductive body formed between in the first and second spacer, and a void formed within the conductive body. In an additional embodiment, the electromagnetic waveguide may include a first spacer and a second spacer. Additionally, the electromagnetic waveguide may include a first portion of a conductive body formed along sidewalls of the first and second spacer and a second portion of the conductive body formed between an upper portion of the first portion of the conductive body. In an embodiment, the first portion of the conductive body and the second portion of the conductive body define a void through the electromagnetic waveguide.

25 Claims, 11 Drawing Sheets

(51) Int. Cl.
   *H01L 21/8234* (2006.01)
   *H01L 23/66* (2006.01)
   *H01P 3/127* (2006.01)
   *H01P 5/12* (2006.01)
   *H01P 11/00* (2006.01)

(52) U.S. Cl.
   CPC .............. *H01L 23/66* (2013.01); *H01P 3/122* (2013.01); *H01P 3/127* (2013.01); *H01P 5/12* (2013.01); *H01P 11/002* (2013.01); *H01L 2223/6627* (2013.01)

(58) Field of Classification Search
   CPC ....... H01L 21/76877; H01L 21/823475; H01L 23/66; H01L 2223/6627; G02B 2006/1215; G02B 6/132; G02B 6/00; G02B 6/122; G02B 6/125
   USPC ........................................................ 333/137
   See application file for complete search history.

(56) References Cited

U.S. PATENT DOCUMENTS

| | | |
|---|---|---|
| 2011/0182548 A1 | 7/2011 | Kopp et al. |
| 2013/0228835 A1 | 9/2013 | Ellis-Monaghan et al. |
| 2013/0294729 A1 | 11/2013 | Layton et al. |
| 2015/0205061 A1 | 7/2015 | Tan et al. |

OTHER PUBLICATIONS

International Search Report and Written Opinion for International Patent Application No. PCT/US2016/069533 dated Sep. 25, 2017, 10 pgs.

* cited by examiner

US 10,811,751 B2

MONOLITHIC SPLITTER USING RE-ENTRANT POLY SILICON WAVEGUIDES

CROSS-REFERENCE TO RELATED APPLICATION

This patent application is a U.S. National Phase Application under 35 U.S.C. § 371 of International Application No. PCT/US2016/069533, filed Dec. 30, 2016, entitled "MONOLITHIC SPLITTER USING RE-ENTRANT POLY SILICON WAVEGUIDES," which designates the United States of America, the entire disclosure of which is hereby incorporated by reference in its entirety and for all purposes.

FIELD OF THE INVENTION

Embodiments of the invention are in the field of semiconductor devices and processing and, in particular, the formation of on-chip electromagnetic waveguides formed between gate electrode spacers with re-entrant profiles.

BACKGROUND OF THE INVENTION

Optical fiber and nano-patterned silicon based waveguides have been used as interconnects on-chip to transmit ultra-high frequencies. Typically, a waveguide includes an inner core layer, a dielectric cladding layer with a refractive index that is higher than the core layer, and an outer shielding layer. Such a structure guides optical waves by total internal reflection. The formation of these components presently requires unique processing operations that are not the same as those used to form the transistors, diodes, and/or other circuitry on the chip. Accordingly, the fabrication of such waveguides requires additional processing operations and utilizes additional area on the surface of the chip. Therefore, the use of such interconnects increases the overall cost of such chips.

DETAILED DESCRIPTION OF THE INVENTION

Figure 1:
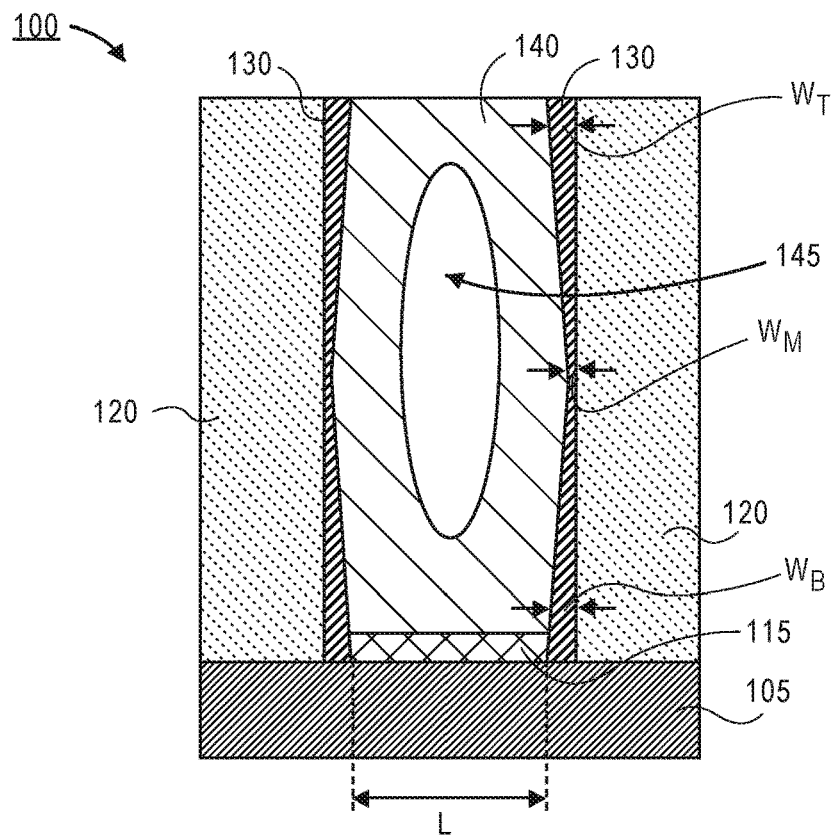
FIG. 1 is a cross-sectional illustration of a waveguide that includes a void formed within a conductive body that is formed between gate electrode spacers, according to an embodiment of the invention.

Described herein are systems that include a semiconductor device and methods for forming the semiconductor device that include on-chip electromagnetic waveguides formed between gate electrode spacers. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Embodiments of the invention include electromagnetic waveguides that are fabricated with structures used to form metal-oxide-semiconductor field-effect-transistor (MOSFET) gates. Particularly, the high aspect ratio and the re-entrant profile of MOSFET gates may be used to fabricate a conductive body with a void that has predictable dimensions. In an embodiment, the dimensions of the void may be chosen so that electromagnetic radiation with a desired frequency may be propagated through the void. Additional embodiments may include further modification to the void (e.g., forming a cladding layer around the void and forming a core within the void) that may improve the propagation of a signal with a desired frequency.

According to an embodiment, the dimensions of the void may be controlled by changing the gate length of the dummy electrode used to fabricate the electromagnetic waveguide. For example, increasing or decreasing the gate length of the dummy electrode may increase or decrease the dimensions of the void. Particularly, shorter gate lengths may allow for relatively higher frequencies to be propagated compared to relatively longer gate lengths. In an embodiment, voids may be formed in a conductive body when the gate length of the dummy electrode is approximately 50 nm or shorter. In additional embodiments, a void may be formed with a multi-part deposition process when the gate length of the dummy electrode is approximately 50 nm or greater.

Since the electromagnetic waveguide is formed using structures used for forming components of active circuitry on a chip, the electromagnetic waveguide may be formed substantially in parallel with the active circuitry. In an embodiment, the electromagnetic waveguide may be fabricated directly on the chip in signal processing region of the device. For example, the electromagnetic waveguides may be fabricated in a region of the chip where antennas and/or receivers/emitters are fabricated. However, it is to be appreciated that the electromagnetic waveguides may be formed at any location on a chip, according to additional embodiments of the invention.

Referring now to FIG. 1 a cross-sectional illustration of an electromagnetic waveguide 100 is shown, according to an embodiment of the invention. According to an embodiment, the electromagnetic waveguide may include a conductive body 140 with a void 145 formed through the conductive body 140. In an embodiment, the conductive body 140 may be formed between spacers 130. For example, the spacers 130 may be gate electrode spacers. Particularly, the spacers 130 may initially be formed along the sidewalls of a dummy gate electrode (not shown in FIG. 1). Accordingly, the spacers 130 will have a profile that substantially matches the profile of the previously formed dummy gate electrode.

In an embodiment, the spacers 130 have a re-entrant profile. As used herein, a re-entrant profile includes a structure with a non-uniform width. For example, the re-entrant profile may include a lower portion and an upper portion of the spacer 130 that is wider than a middle portion of the spacer 130. In a particular embodiment, the width $W_T$ proximate to a top portion of the spacers 130 is greater than a width $W_M$ proximate to a middle portion of the spacers 130, and the width $W_B$ proximate to a bottom portion of the spacers 130 is greater than the width $W_M$ proximate to the middle of the spacers 130. In some embodiments the width $W_B$ may be substantially similar to the width $W_T$, though embodiments are not limited to such configurations. For example, the width $W_B$ may be different than the width $W_T$.

According to an embodiment, the void 145 may be sized so that electromagnetic signals may be propagated through the void 145. As the size of the void 145 is changed, different frequencies may be propagated along the electromagnetic waveguide. In an embodiment, the size of the void 145 may be controlled by altering the length L between the spacers 130 (i.e., by altering the gate length of a dummy gate electrode). For example, the length L may be less than approximately 50 nm. In an embodiment, the length L is approximately 42 nm or less. In an embodiment, the length L may be approximately 14 nm or less. Changes in the length L result in a change in the dimensions of the void 145 because the conductive body 140 is formed with a conformal deposition process. Particularly, the conformal growth of the conductive body 140 combined with the re-entrant profile of the spacers 130 results in the conductive body 140 merging together near the top of the conductive body 140 prior to the opening between the spacers 130 being completely filled.

In an embodiment, the spacers 130 may have an isolation layer 120 formed on the sidewalls opposite the conductive body 140. Embodiments may include an isolation layer 120 that is an insulating material. For example, the isolation layer 120 may be a shallow trench isolation (STI) layer. Additionally, a sacrificial layer 115 may be formed below the conductive body 140. The sacrificial layer 115 may separate the conductive body 140 from a substrate 105. In some embodiments, the sacrificial layer 115 may be omitted.

According to an embodiment, the substrate 105 may be any suitable substrate used in semiconductor manufacturing. In an embodiment, the substrate 105 may be silicon. Additional embodiments may include semiconductor substrates 105 that are formed with other semiconductor materials, such as III-V semiconductor materials. The substrate 105 may be a single semiconductor material or the fins may include a stack of two or more semiconductor materials. For example, the semiconductor substrate 105 may include a silicon base layer and one or more III-V semiconductor materials grown over the silicon base layer. In one example, a GaN layer may be separated from the silicon base layer by one or more buffer layers. In other implementations, the semiconductor substrate may be formed using alternate materials, which may or may not be combined with silicon, that include but are not limited to germanium, indium antimonite, lead telluride, indium arsenide, indium phosphide, gallium arsenide, indium gallium arsenide, gallium antimonite, or other combinations of group III-V or group IV materials. In one implementation, the semiconductor substrate 105 may be a crystalline substrate formed using a bulk semiconductor or a semiconductor-on-insulator substructure. Although a few examples of materials from which the substrate 105 may be formed are described here, any material that may serve as a foundation upon which a semiconductor device may be built falls within the spirit and scope of embodiments of the invention.

In an embodiment, the substrate 105 may also be doped. For example, the substrate 105 may be doped to provide source and drain regions in active device circuitry formed on the substrate 105 (not shown). In an embodiment, the substrate 105 may be doped with an implantation/diffusion process. For example, dopants (e.g., boron, phosphorous, silicon, magnesium, nitrogen, or any other commonly used dopant) may be ion-implanted into the substrate 105. An annealing process that activates the dopants and causes them to diffuse further into the substrate 105 typically follows the ion implantation process.

Figure 2:
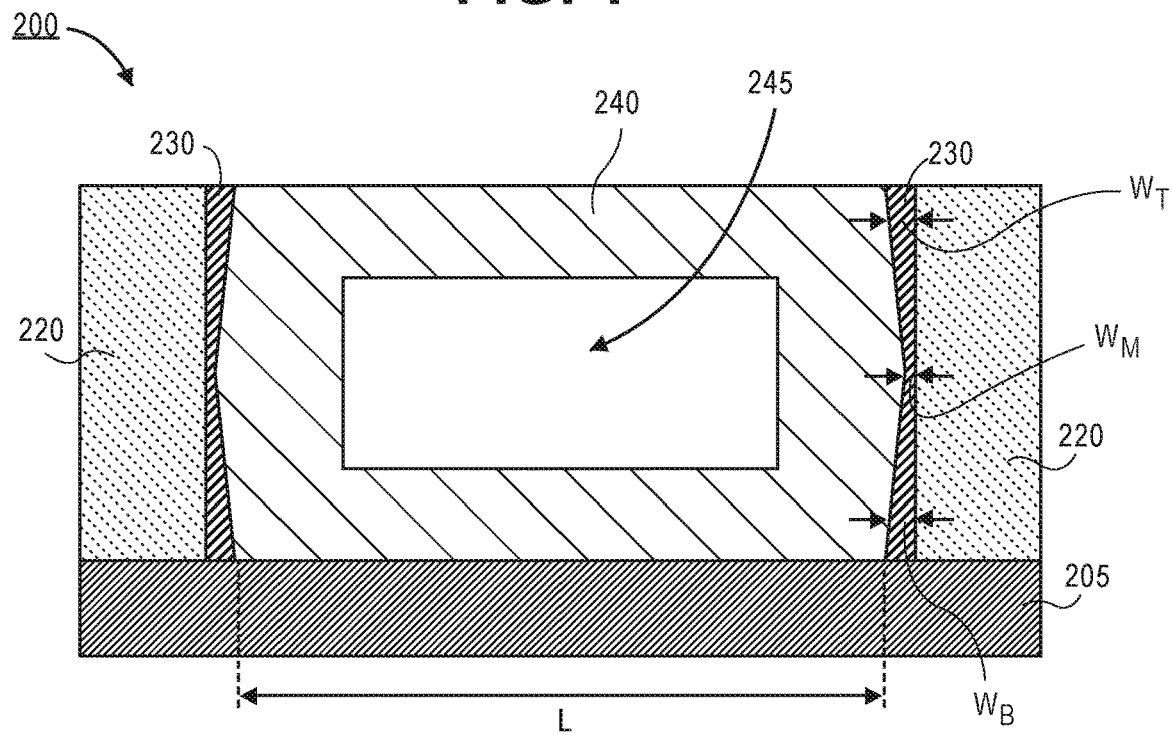
FIG. 2 is a cross-sectional illustration of a waveguide that includes a void formed within a conductive body that is formed with a two-part deposition process, according to an additional embodiment of the invention.

Referring now to FIG. 2, a cross-sectional illustration of an electromagnetic waveguide 200 is shown, according to an additional embodiment of the invention. Electromagnetic waveguide 200 may be similar to the electromagnetic waveguide 100 in FIG. 1, with the exception that the shape of the void 245 is different and the spacing L between the spacers 230 is increased. The shape of the void 245 may be different than the shape of the void 145 in FIG. 1 because the void 245 in FIG. 2 is formed with a different process. For example, when the length L between the spacers is longer than approximately 50 nm, embodiments of the invention may utilize a multi-part deposition process that includes the formation of a sacrificial layer. The sacrificial layer may subsequently be removed to form the void 245.

Particularly, the increased spacing L between the spacers results in the conformal deposition process becoming substantially a bottom-up filling process. As such, the use of a single conformal deposition process may not form a void when the spacing L is increased beyond approximately 50 nm. In an embodiment, the multi-part deposition process may include a first conformal deposition process that forms a first portion of the conductive body over the substrate 205 and along the sidewalls of the spacers 230. However, an opening between the spacers 230 may still remain, and a sacrificial material may be deposited into the opening. Thereafter, a second conformal deposition process may be used to cover the sacrificial material, and the sacrificial material may then be removed to form the void 245. A more detailed description of the multi-part deposition process is described below. Accordingly, embodiments of the invention may allow for voids 245 to be formed that have a shape substantially similar to a shape of the sacrificial material deposited between a first conformal deposition process and a second conformal deposition process.

Figure 3A:
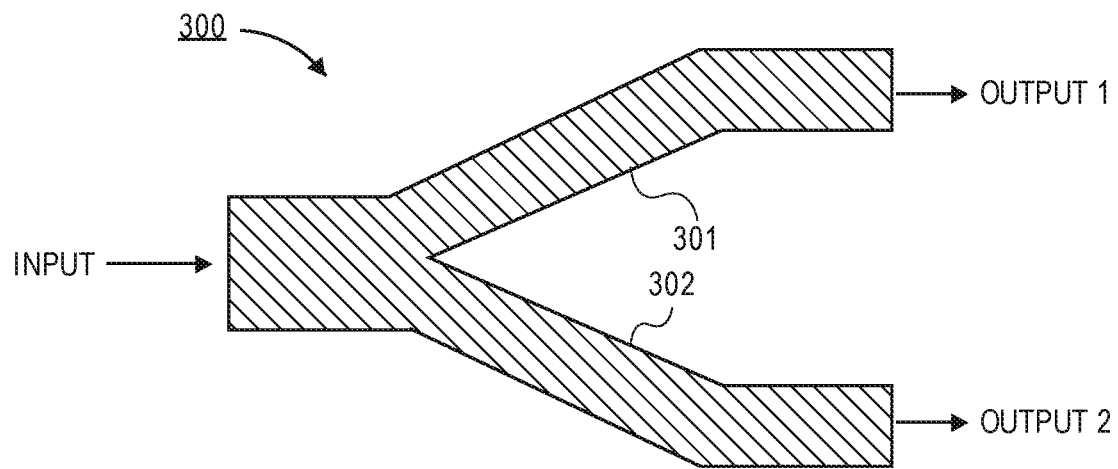
FIG. 3A is a plan view illustration of a waveguide that includes a Y-shaped splitter, according to an additional embodiment of the invention.
Figure 3B:
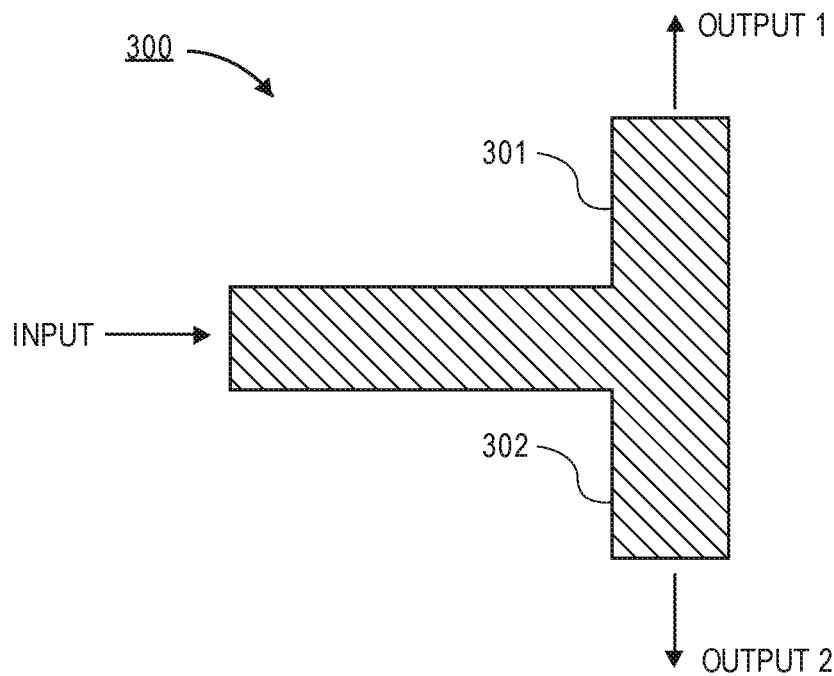
FIG. 3B is a plan view illustration of a waveguide that includes a T-shaped splitter, according to an additional embodiment of the invention.

Referring now to FIGS. 3A and 3B, plan view schematic illustrations of portions of an electromagnetic waveguide 300 are shown according to embodiments of the invention. The electromagnetic waveguides 300 may be substantially similar to the waveguides 100 or 200 described above. In an embodiment, the electromagnetic waveguides 300 may include any desired path over a semiconductor substrate in order to form electromagnetic waveguides for routing electromagnetic signals between any components on a substrate. In an embodiment, the path of the electromagnetic waveguide 300 may be defined during the formation of dummy gate electrodes that are formed during the fabrication of active devices on the substrate. In an embodiment, a material used to form the dummy gate electrode (e.g., polysilicon) may be blanket deposited over the substrate. Thereafter, the dummy gate electrode material is patterned to define the shape of the dummy gate electrodes and the path of the electromagnetic waveguides 300. As such, the addition of on-chip electromagnetic waveguides formed according to embodiments of the invention does not add additional patterning operations to the fabrication of the device.

In addition to providing direct pathways between two components, embodiments may also include electromagnetic waveguides that allow for a signal to be split or combined. For example, in FIG. 3A, the electromagnetic waveguide includes a Y-shaped splitter. In such an embodiment, an input signal may be propagated into the waveguide 300 and be split so that a first output is delivered along an upper arm 301 of the waveguide 300 and a second output is delivered along a lower arm 302 of the waveguide 300. Similarly, a T-shaped splitter is illustrated in FIG. 3B. The T-shaped splitter may also allow for an input signal to be propagated into the waveguide 300 and be split so that a first output is delivered along an upper arm 301 of the waveguide 300 and a second output is delivered along a lower arm 302 of the waveguide 300. Accordingly, embodiments of the invention may allow for two or more components to be communicatively coupled by electromagnetic waveguides. While examples of waveguide splitters are shown in FIGS. 3A and 3B, it is to be appreciated that a combiner may be formed with substantially similar features, and allow for two input signals to be combined to form a single output signal.

Figure 4A:
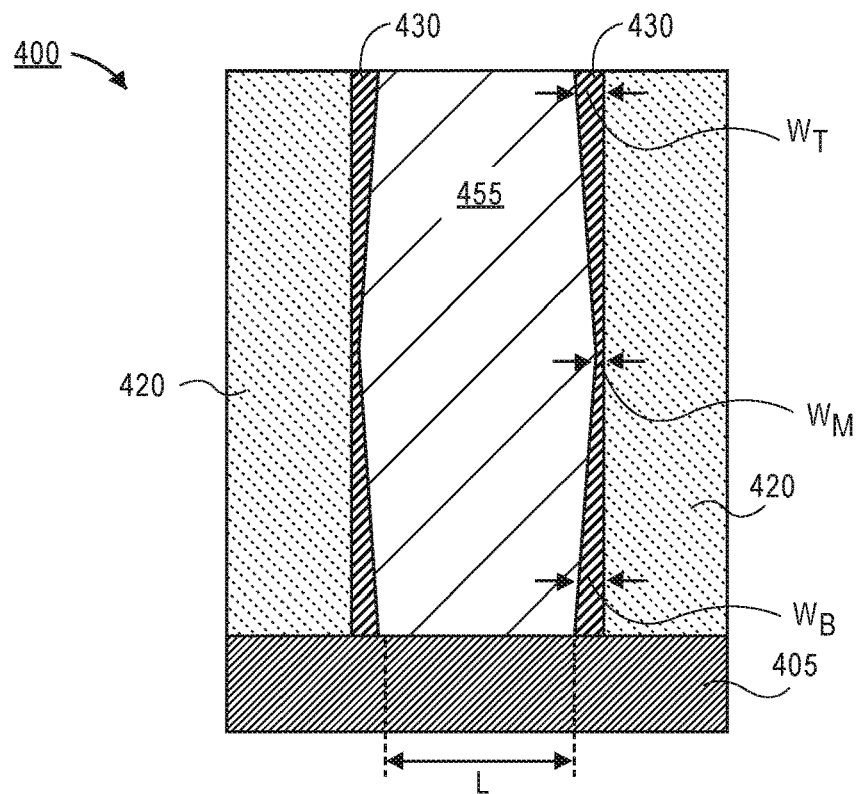
FIG. 4A is a cross-sectional illustration of a dummy gate electrode with spacers formed along the sidewalls of the dummy gate electrode, according to an embodiment of the invention.

Referring now to FIGS. 4A-4G, a series of cross-sectional illustrations that show a process for forming an electromagnetic waveguide 400 are shown, according to an embodiment of the invention. Referring now to FIG. 4A, a cross-sectional illustration of a dummy gate electrode 455 is shown, according to an embodiment of the invention. In an embodiment, the dummy gate electrode 455 may be polysilicon. For example, a polysilicon layer may be blanket deposited over a substrate 405 and subsequently patterned to form the shape of the dummy gate electrode 455. In an embodiment, the patterned dummy gate electrode 455 may be patterned to include any desired shape to electrically couple two or more components on the substrate 405 once the waveguide 400 is fabricated. For example, the dummy gate electrode 455 may be patterned to include any number of combiners or splitters, such as those illustrated in FIGS. 3A and 3B. Furthermore, it is to be appreciated that the dummy gate electrode 455 may be patterned with the same processing operations used to form dummy gate electrodes needed for active device circuitry (e.g., MOSFETS, etc.) formed on the substrate 405. Accordingly, the formation of a dummy gate electrode for use in fabricating the electromagnetic waveguide 400 may not require additional patterning operations. Therefore, the inclusion of electromagnetic waveguides 400 according to embodiments of the invention may not significantly increase the cost of device.

According to an embodiment, the dummy gate electrode 455 may not have a uniform width. For example, the middle portion of the dummy gate electrode 455 may be wider than the bottom and top portions of the dummy gate electrode 455. Accordingly, when the spacers 430 are subsequently formed along the sidewalls of the dummy gate electrode 455, the spacers 430 may include a re-entrant profile. In an embodiment, the spacers 430 may be formed with a standard spacer deposition and patterning process known in the art. As will be described in greater detail below, the re-entrant profile of the spacers 430 allows for a void to be formed in a conductive body that is deposited between the spacers 430, thereby allowing electromagnetic radiation to be propagated along a desired pathway. In an embodiment, the gate length L of the dummy gate electrode 455 may be controlled to provide a void with desired dimensions. For example, increasing the length L may increase the dimensions of the subsequently formed void. In an embodiment, an isolation layer 420 (e.g., an STI layer) may also be formed along the sidewalls of the spacers 430 that face away from the dummy gate electrode 455.

Figure 4B:
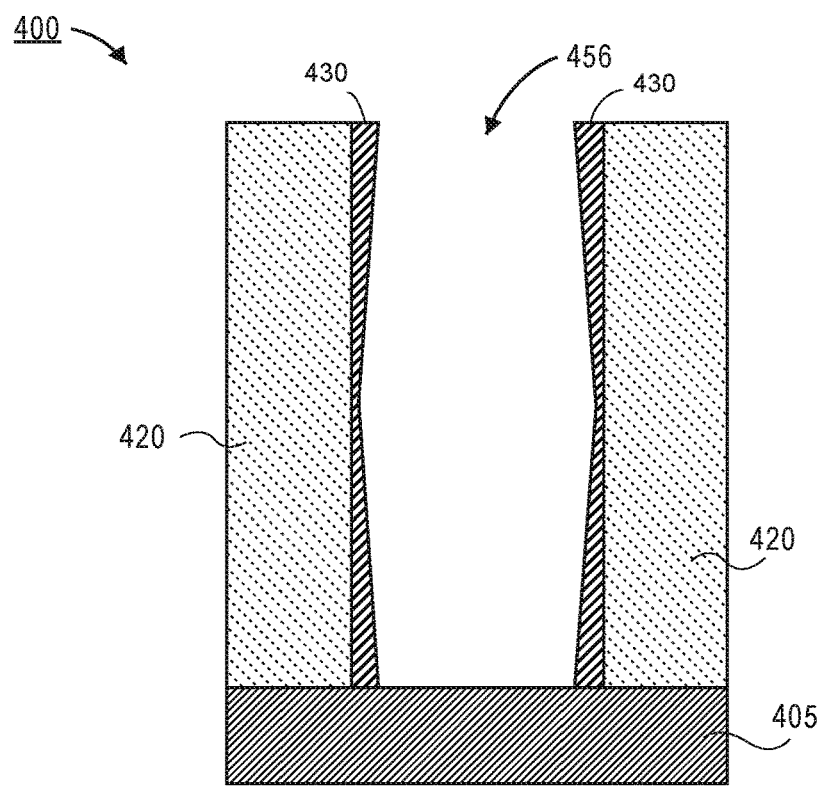
FIG. 4B is a cross-sectional illustration of the structure in FIG. 4A after the dummy gate electrode is removed, according to an embodiment of the invention.

Referring now to FIG. 4B, a cross-sectional illustration of the electromagnetic waveguide 400 after the dummy gate electrode 455 is removed is shown, according to an embodiment of the invention. In an embodiment, the dummy gate electrode 455 may be removed with any suitable etching process. For example, the dummy gate electrode 455 may be removed with a wet or dry etching process. The removal of the dummy gate electrode 455 forms an opening 456 that will house the conductive body of the electromagnetic waveguide 400.

Figure 4C:
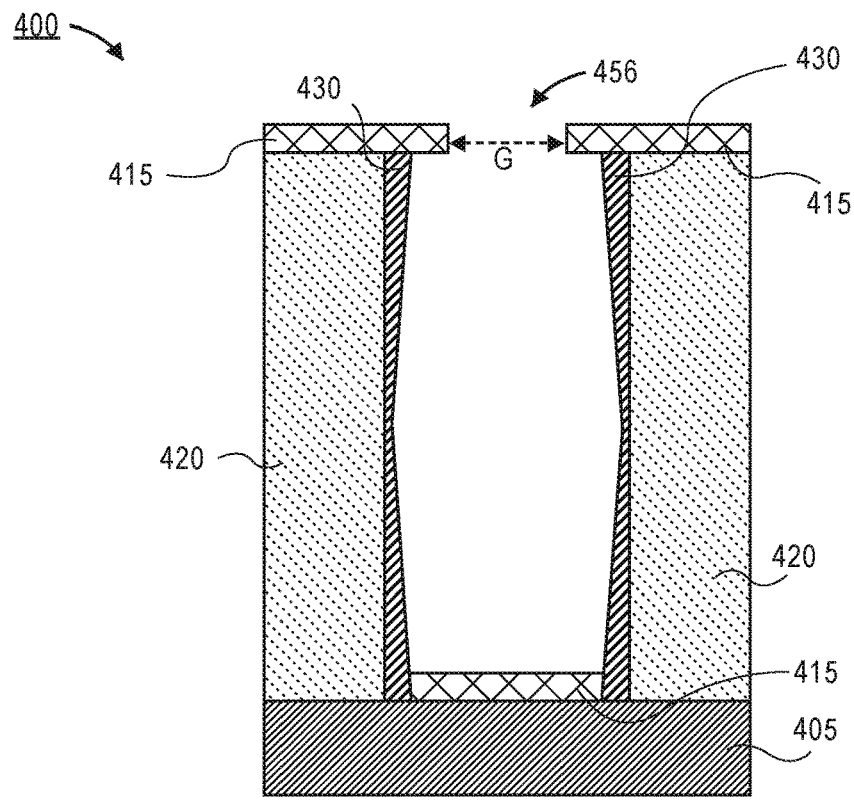
FIG. 4C is a cross-sectional illustration of the structure in FIG. 4B after a sacrificial layer is deposited over the structure, according to an embodiment of the invention.

Referring now to FIG. 4C, a cross-sectional illustration of the electromagnetic waveguide 400 after a sacrificial layer 415 is deposited over the exposed surfaces is shown, according to an embodiment of the invention. The sacrificial layer 415 may be any material that can be deposited with a non-conformal deposition process. In a particular embodiment, the sacrificial layer 415 may be titanium nitride. In an embodiment, the sacrificial layer 415 may be deposited with a non-conformal deposition process, such as a sputtering process. Accordingly, the sacrificial layer may preferentially form on non-vertical surfaces. Additionally, as the sacrificial layer 415 grows, the width of the opening 456 is reduced. For example, the sacrificial layer 415 may be grown so that a gap G in the opening 456 is less than 50 nm. In an embodiment the gap G may be less than 14 nm. Reducing the width of the gap G enhances the effect of the re-entrant profile of the spacers 430 in forming the void in subsequent processing operations. For example, if the re-entrant profile of the spacers 430 is not severe enough to produce a void, a smaller gap G may be used to produce the desired void dimensions. In some embodiments, the re-entrant profile of the spacers 430 may yield the desired dimensions for the void without the need for a sacrificial layer 415, and the sacrificial layer 415 may be omitted.

Figure 4D:
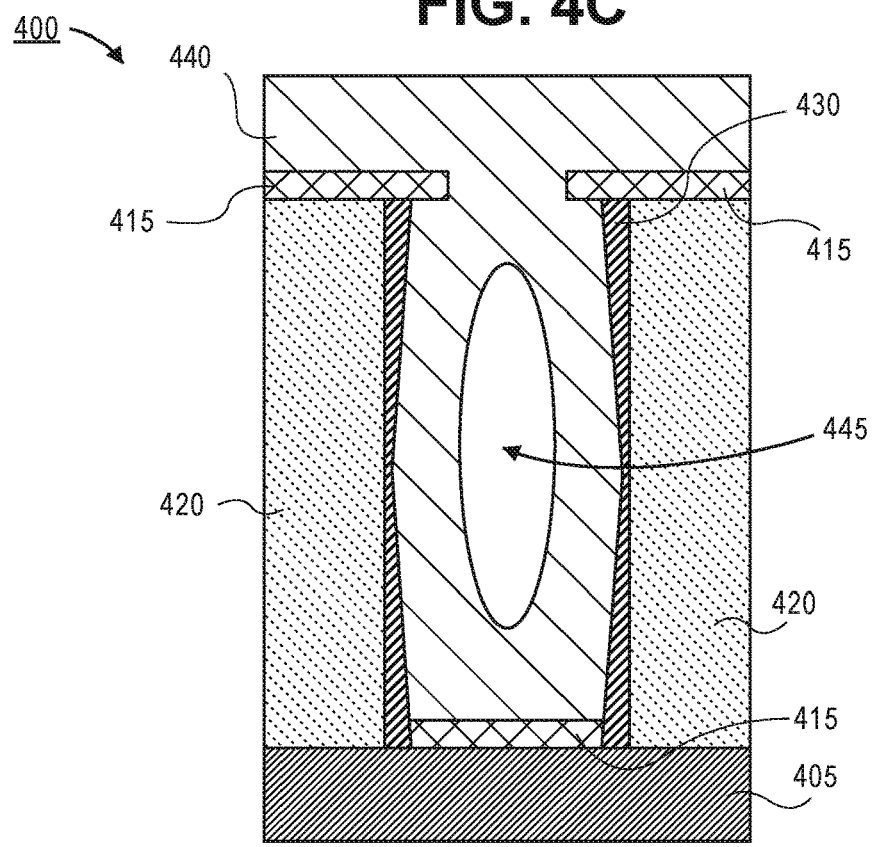
FIG. 4D is a cross-sectional illustration of the structure in FIG. 4C after a conductive body is deposited into the opening between the spacers and a void is formed in the conductive body, according to an embodiment of the invention.

Referring now to FIG. 4D, a cross-sectional illustration of the electromagnetic waveguide 400 after the conductive body 440 is deposited is shown, according to an embodiment of the invention. In an embodiment, the conductive body 440 is a metallic material. For example, the conductive body 440 may be tungsten. In an embodiment, the conductive body 440 is deposited with a conformal deposition process. For example, the conductive body 440 may be deposited with an atomic layer deposition (ALD) process. Accordingly, the conductive body 440 is deposited along all exposed surfaces of the waveguide 400.

In an embodiment, a void 445 is formed in the conductive body 440 because the conductive body 440 merges together proximate to a top portion of the spacers 430 before the conductive body 440 merges together proximate to a central point of the spacers 430 due to the re-entrant profile of the spacers 430 and (optionally) the formation of a gap G in the opening 456. Particularly, the shape of the void 445 may be dependent on the length L, the size of the gap G, and the height of the spacers 430, among other factors.

Figure 4E:
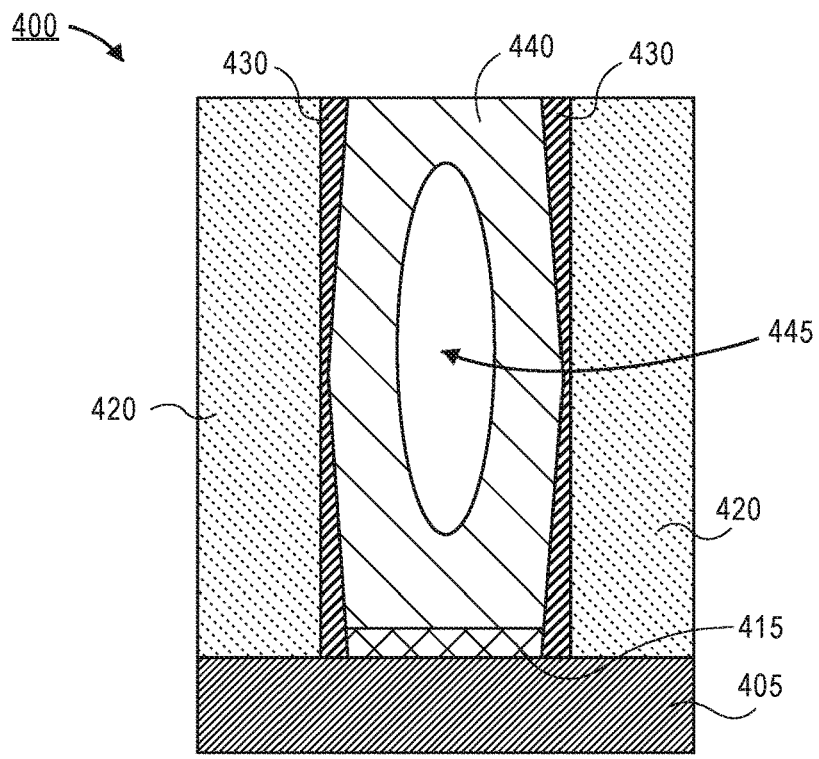
FIG. 4E is a cross-sectional illustration of the structure in FIG. 4D after the overburden from the conductive body is removed, according to an embodiment of the invention.

Referring now to FIG. 4E, a cross-sectional illustration of the electromagnetic waveguide 400 after the excess material from the conductive body 440 is removed is shown, according to an embodiment of the invention. For example, the excess material may be removed with a polishing process, such as a chemical mechanical planarization (CMP) process. In an embodiment, the portions of the sacrificial material 415 deposited over the top surfaces of the spacers 430 and the STI layer 420 may also be removed with the planarization process.

Figure 4F:
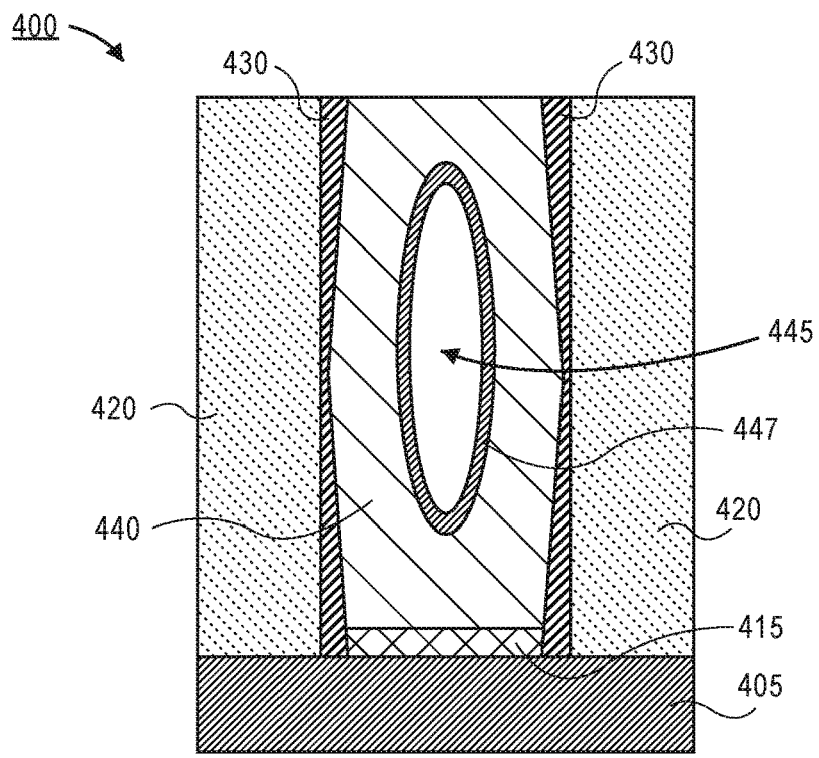
FIG. 4F is a cross-sectional illustration of the structure in FIG. 4E after a cladding layer is formed around the surfaces of the void, according to an embodiment of the invention.

Referring now to FIG. 4F, a cross-sectional illustration of the electromagnetic waveguide 400 after a cladding layer 447 is deposited is shown, according to an embodiment of the invention. In an embodiment, the cladding layer 447 may be a dielectric material that is used to improve the propagation of a signal with a desired frequency. For example, the cladding layer 447 may be glass. Additionally, it is to be appreciated that the cladding layer 447 may be formed with a conformal deposition process, such as an ALD process. As such, the cladding layer 447 may form over the surfaces of the conductive body 440 within the void 445 without filling the void 445. In an embodiment, the cladding layer 445 may also be doped in order to alter the refractive index of the cladding layer 445 to improve transmission of a desired frequency and/or to attenuate undesired frequencies of electromagnetic radiation. For example, the dopants may be in-situ deposited during the ALD process.

Figure 4G:
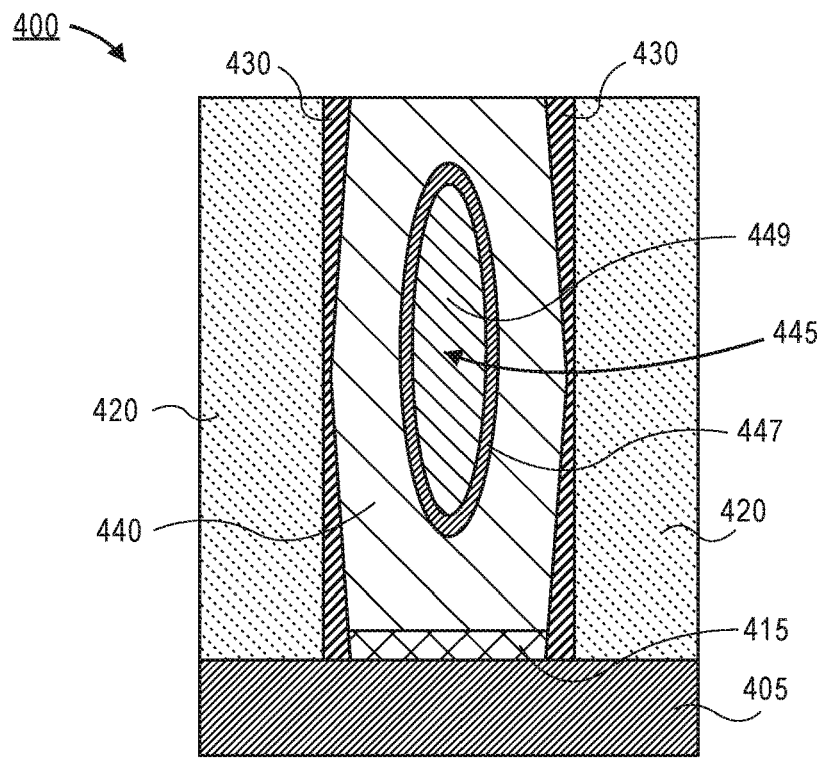
FIG. 4G is a cross-sectional illustration of the structure in FIG. 4F after a core has been formed in the void, according to an embodiment of the invention.

Referring now to FIG. 4G, a cross-sectional illustration is shown after a core 449 is deposited within the void 445. In an embodiment, the core 449 may be a material that has a refractive index that is greater than the refractive index of the cladding layer 447. In an embodiment, the core 449 is an insulative material. For example, the core may be an oxide, such as an STI oxide. In an embodiment, the core 449 is deposited with a conformal deposition process, such as ALD in order to allow for the core 449 to be formed within the void 445. After the material used to form the core 445 is deposited, an etching process (e.g., a dry etching process) may be used to remove the portions of the core material from outside the void 445. Since the core 445 is shielded from the etching chemistry by the conductive body 440, the core 449 will remain in the void 445 after the excess core material is removed. In additional embodiments, the excess core material may not be removed from outside the electromagnetic waveguide 400.

Embodiments of the invention may also include voids that are formed when the spacing L between the spacers is greater than approximately 50 nm. In such embodiments, it may not be possible to form a void with a single conformal deposition process, even when the spacers have a re-entrant profile. In such embodiments, a multi-part deposition process in conjunction with the deposition of a sacrificial material may be used to form a void in the conductive body. A process for forming an electromagnetic waveguide according to such an embodiment is shown and described with respect to FIGS. 5A-5G.

Figure 5A:
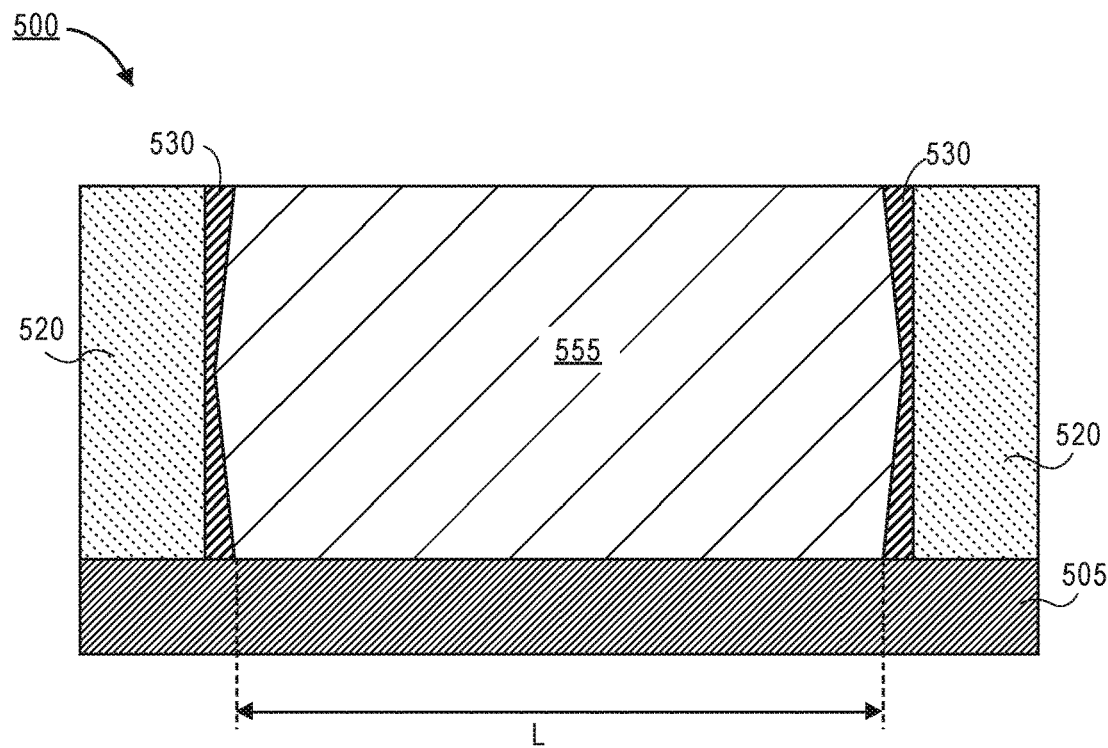
FIG. 5A is a cross-sectional illustration of a dummy gate electrode with spacers formed along the sidewalls of the dummy gate electrode, according to an embodiment of the invention.

Referring now to FIG. 5A, a cross-sectional illustration of an electromagnetic waveguide 500 after a dummy gate electrode 555 is formed is shown, according to an embodiment of the invention. In an embodiment, the dummy gate electrode 555 may be substantially similar to the dummy gate electrode 455 described above with respect to FIG. 4A, with the exception that the gate length L is longer. For example, the gate length L may be approximately 50 nm or larger. In an embodiment, the gate length may be approximately 100 nm or larger. In an embodiment, the spacers 530 may be formed with typical spacer deposition and patterning processes known in the art. While the spacers 530 illustrated in FIG. 5A include a re-entrant profile, it is to be appreciated that embodiments of the invention do not require a re-entrant profile to form a void according to embodiments of the invention.

Figure 5B:
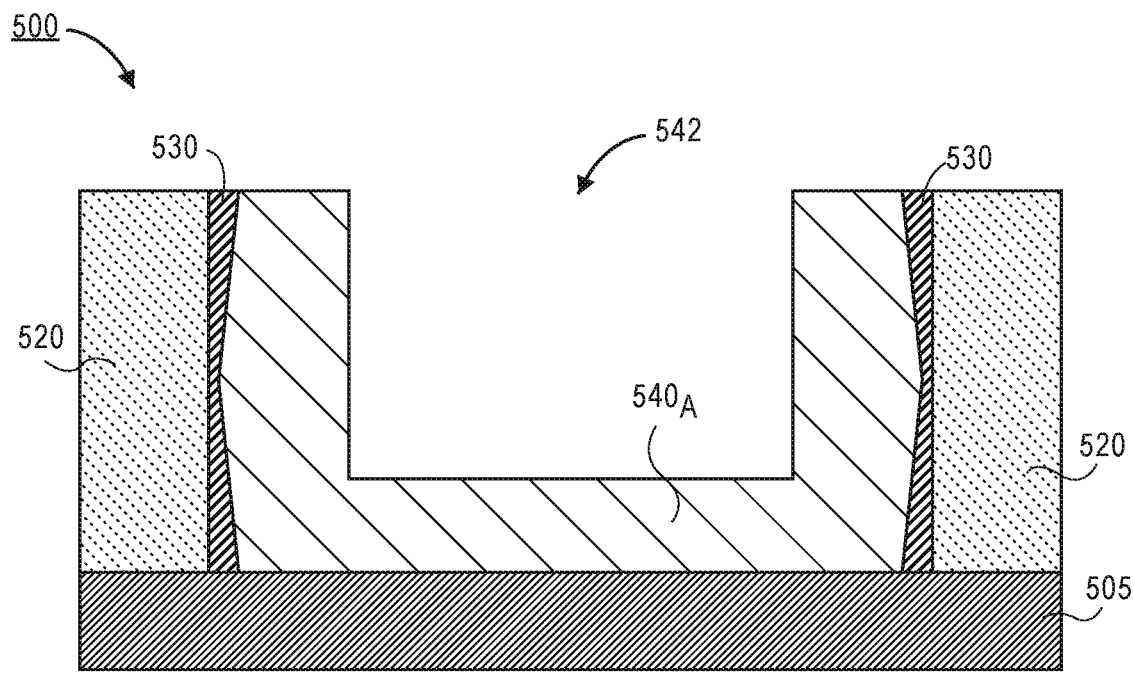
FIG. 5B is a cross-sectional illustration of the structure in FIG. 5A after the dummy gate electrode is removed and a first portion of a conductive body is formed with a conformal deposition process, according to an embodiment of the invention.

Referring now to FIG. 5B, a cross-sectional illustration of the electromagnetic waveguide 500 after a first portion of the conductive body $540_A$ is formed is shown, according to an embodiment of the invention. In an embodiment, the first portion of the conductive body $540_A$ may be formed with a conformal deposition process, such as an ALD process, after the dummy gate electrode is removed. In an embodiment the first portion of the conductive body $540_A$ may be any conductive material, such as tungsten. Due to the conformal deposition process, the first portion of the conductive body $540_A$ may form primarily along the sidewalls of the spacers 530 and the surface of the substrate 505. Furthermore, since the length L is longer than the embodiments described above with respect to FIGS. 4A-4G, the first portion of the conductive body $540_A$ formed along the sidewalls of the spacers 530 does not merge together to form a void. Instead, the first portion of the conductive body $540_A$ may define an opening 542 between the spacers 530.

Figure 5C:
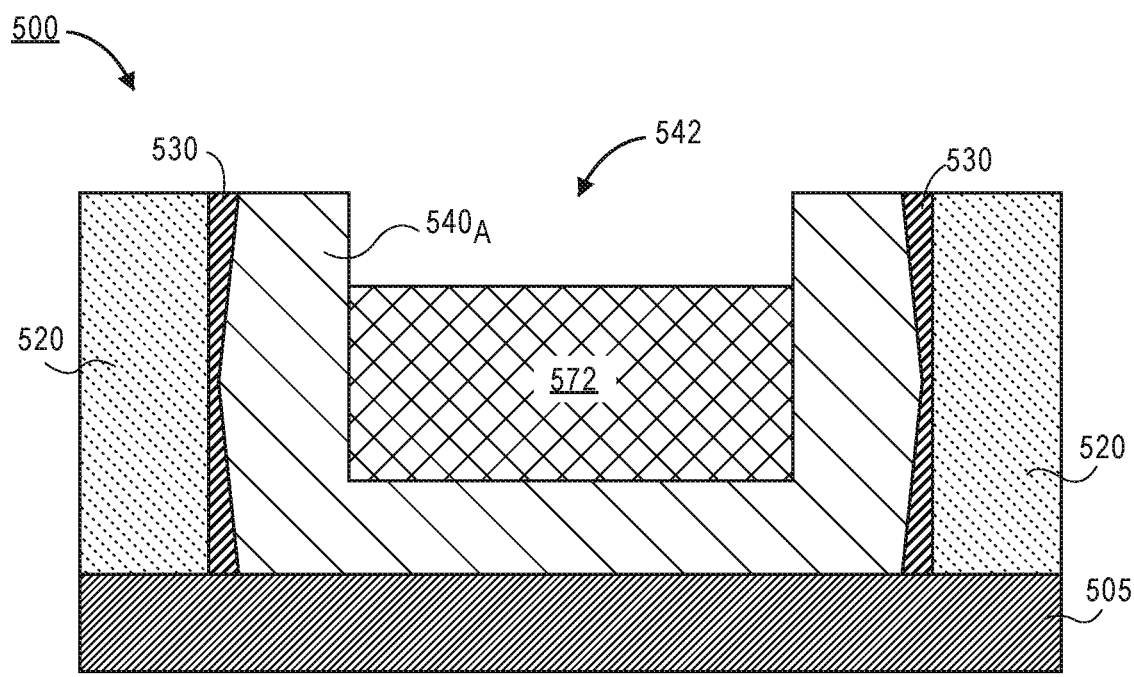
FIG. 5C is a cross-sectional illustration of the structure in FIG. 5B after a sacrificial layer is formed over the first portion of the conductive body, according to an embodiment of the invention.

Referring now to FIG. 5C, a cross-sectional illustration of the electromagnetic waveguide 500 after a sacrificial material 572 is deposited into the opening 542 is shown, according to an embodiment of the invention. In an embodiment, the sacrificial material may be deposited with a non-conformal deposition process, such as a sputtering process. As such, the sacrificial material 572 may fill the opening 542 with a bottom-up process. In an embodiment, the sacrificial material 572 may be any material that can be etched selectively with respect to the conductive material used to form the conductive body 540. For example, the sacrificial material may be titanium nitride, glass, an oxide, or the like. In an embodiment, the thickness of the sacrificial material may be chosen to provide the desired dimensions for the void in the electromagnetic waveguide.

Figure 5D:
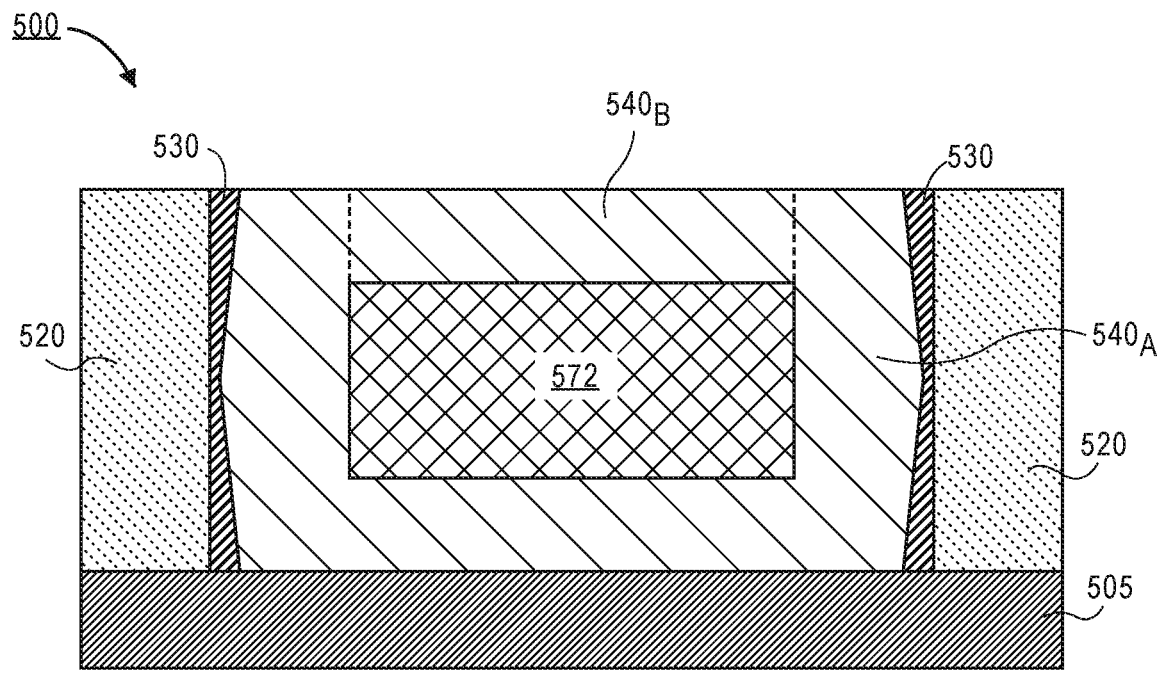
FIG. 5D is a cross-sectional illustration of the structure in FIG. 5C after a second portion of the conductive body is formed over the sacrificial layer, according to an embodiment of the invention.

Referring now to FIG. 5D, a cross-sectional illustration of the electromagnetic waveguide 500 after a second portion of the conductive body $540_B$ is formed is shown, according to an embodiment of the invention. In an embodiment, the second portion of the conductive body $540_B$ may be formed with the same material as the first portion of the conductive body $540_A$. For example, the second portion of the conductive body $540_B$ may be tungsten. Additional embodiments may include forming the second portion of the conductive body $540_B$ with a different material than the first portion of the conductive body $540_A$. In an embodiment, the second portion of the conductive body $540_B$ may be deposited with a conformal deposition process, such as ALD. Additional embodiments may include forming the second portion of the conductive body $540_B$ with a non-conformal deposition process. In an embodiment, the second portion of the conductive body $540_B$ may cover the top surface of the sacrificial material 572. Embodiments of the invention may also include a polishing process, such as a CMP process, to planarize a top surface of the second portion of the conductive body $540_B$ with a top surface of the spacers 530.

Figure 5E:
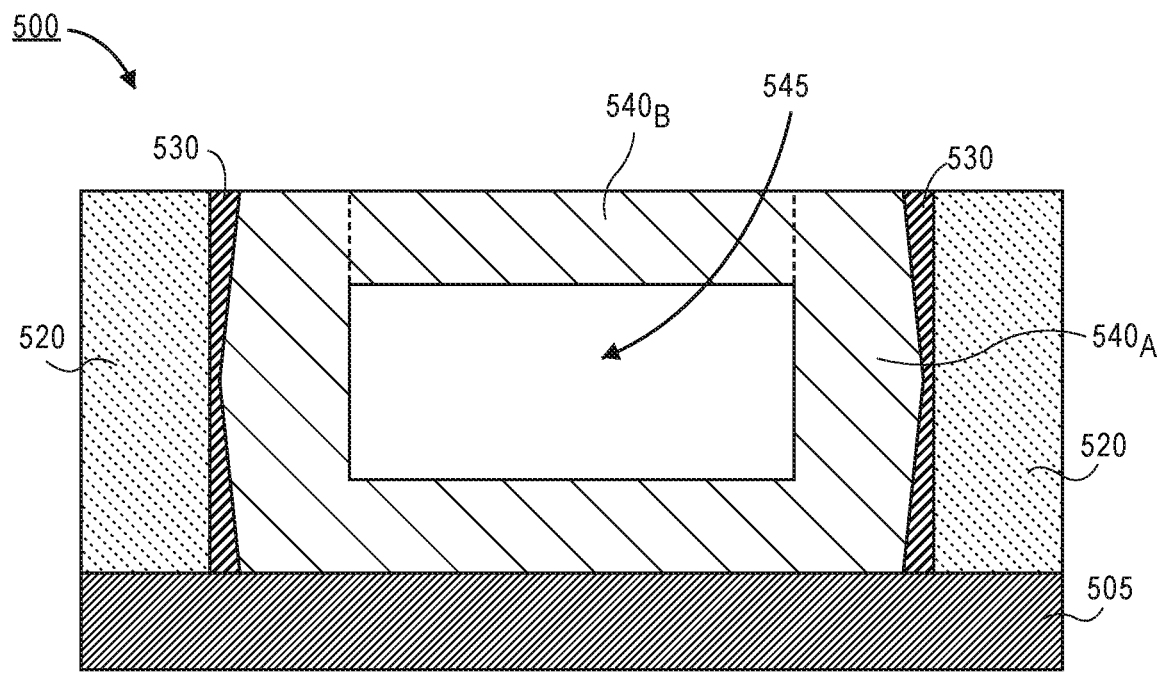
FIG. 5E is a cross-sectional illustration of the structure in FIG. 5D after the sacrificial layer is removed to form a void defined by the first and second portions of the conductive body, according to an embodiment of the invention.

Referring now to FIG. 5E, a cross-sectional illustration of the electromagnetic waveguide 500 after the sacrificial material 572 is remove to form a void 545 is shown, according to an embodiment of the invention. In an embodiment, the sacrificial material 572 may be removed with a wet etching process. For example, the wet etching process may preferentially remove the sacrificial material 572, leaving behind the first and second portions of the conductive body $540_A$ and $540_B$. Accordingly, the shape of the void 545 may be substantially similar to the shape of the sacrificial material 572.

Figure 5F:
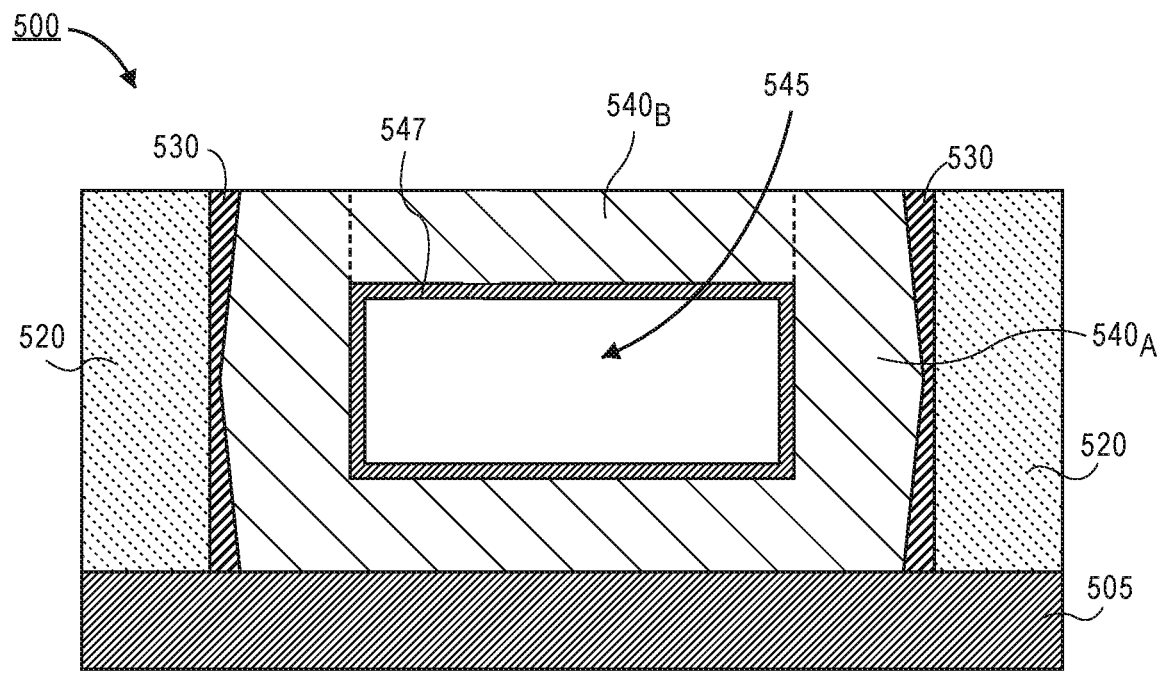
FIG. 5F is a cross-sectional illustration of the structure in FIG. 5E after a cladding layer is formed around the surfaces of the void, according to an embodiment of the invention.

Referring now to FIG. 5F, a cross-sectional illustration of the electromagnetic waveguide 500 after a cladding layer 547 is deposited is shown, according to an embodiment of the invention. In an embodiment, the cladding layer 547 may be a dielectric material. For example, the cladding layer 547 may be glass. Additionally, it is to be appreciated that the cladding layer 547 may be formed with a conformal deposition process, such as an ALD process. As such, the cladding layer 547 may form over the surfaces of the first and second portions of the conductive body $540_A$ and $540_B$ within the void 545 without filling the void 545. In an embodiment, the cladding layer 545 may also be doped in order to alter the refractive index of the cladding layer 545 to improve transmission of a desired frequency and/or to attenuate undesired frequencies of electromagnetic radiation. For example, the dopants may be in-situ deposited during the ALD process.

Figure 5G:
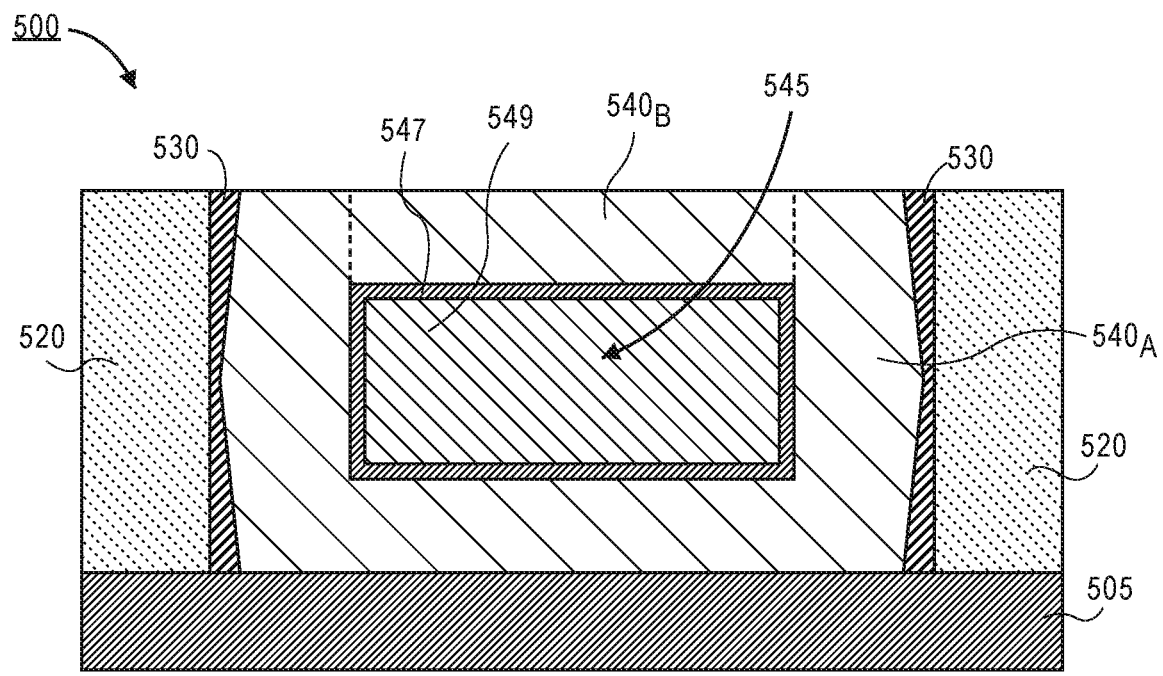
FIG. 5G is a cross-sectional illustration of the structure in FIG. 5F after a core is formed in the void, according to an embodiment of the invention.

Referring now to FIG. 5G, a cross-sectional illustration is shown after a core 549 is deposited within the void 545. In an embodiment, the core 549 may be a material that has a refractive index that is greater than the refractive index of the cladding layer 547. In an embodiment, the core 549 is an insulative material. For example, the core may be an oxide, such as an STI oxide. In an embodiment, the core 549 is deposited with a conformal deposition process, such as ALD in order to allow for the core 549 to be formed within the void 545. After the material used to form the core 545 is deposited, an etching process (e.g., a dry etching process) may be used to remove the portions of the core material from outside the void 545. Since the core 545 is shielded from the etching chemistry by the first and second portions of the conductive body $540_A$ and $540_B$, the core 549 will remain in the void 545 after the excess core material is removed. In additional embodiments, the excess core material may not be removed from outside the electromagnetic waveguide 500.

Figure 6:
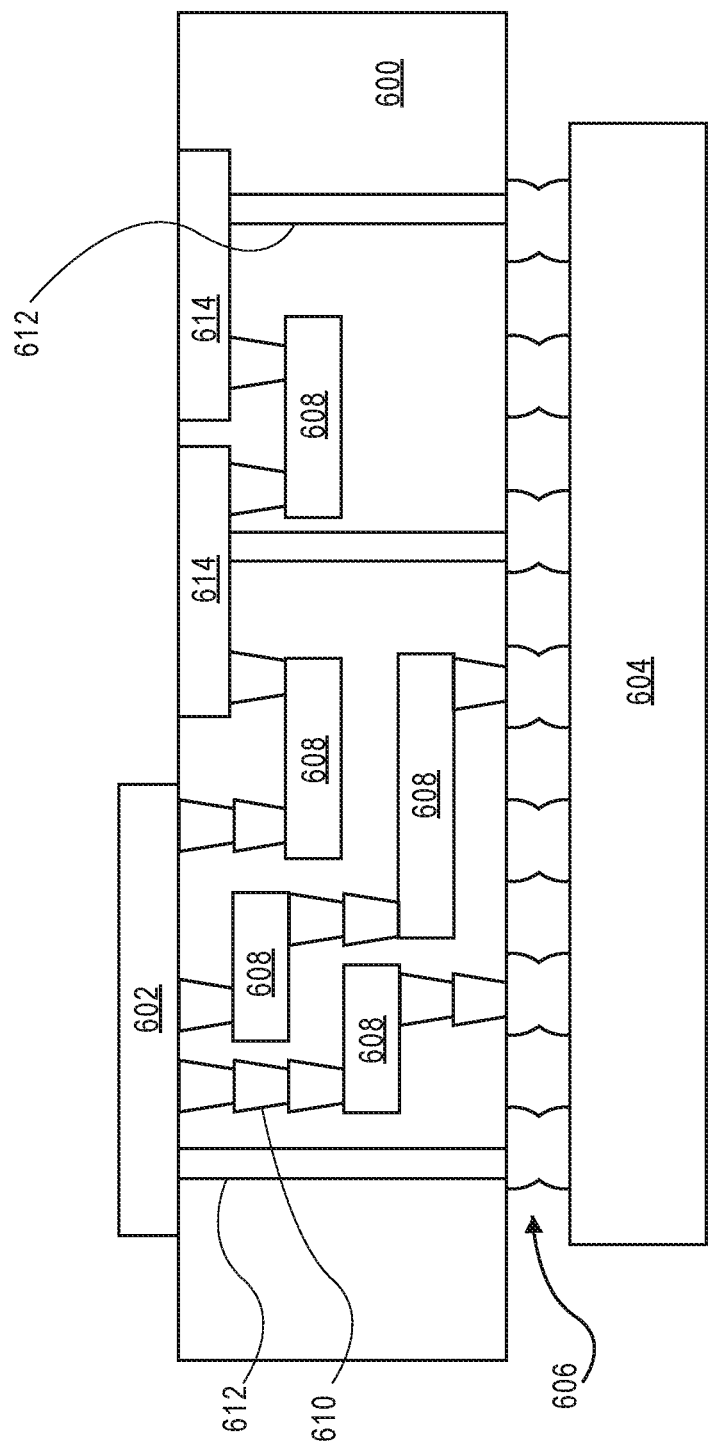
FIG. 6 is a cross-sectional illustration of an interposer implementing one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the invention, apparatuses that include electromagnetic waveguides formed between gate electrode spacers, or processes for forming such devices disclosed herein may be used in the fabrication of interposer 600.

Figure 7:
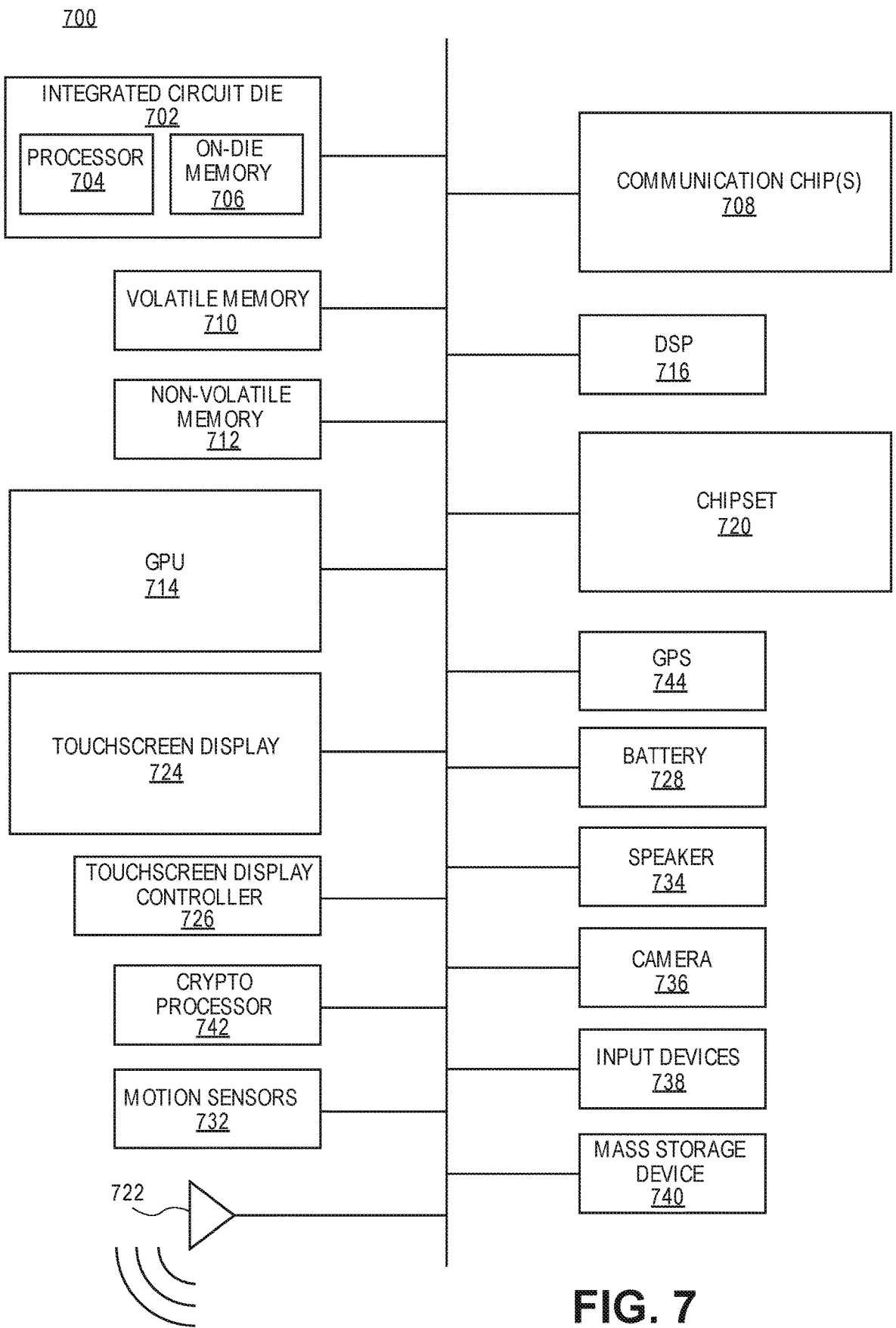
FIG. 7 is a schematic of a computing device that includes one or more transistors built in accordance with an embodiment of the invention.

FIG. 7 illustrates a computing device 700 in accordance with one embodiment of the invention. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a global positioning system (GPS) device 744, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The processor 704 of the computing device 700 includes one or more devices, such as electromagnetic waveguides formed between gate electrode spacers, according to an embodiment of the invention. The term "processor" may refer to any device or portion of a device that processes electronic data from registers and/or memory to transform that electronic data into other electronic data that may be stored in registers and/or memory.

The communication chip 708 may also include one or more devices, such as electromagnetic waveguides formed between gate electrode spacers, according to an embodiment of the invention.

In further embodiments, another component housed within the computing device 700 may contain one or more devices, such as electromagnetic waveguides formed between gate electrode spacers, or processes for forming such devices, according to an embodiment of the invention.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electromagnetic waveguide, comprising: a first spacer; a second spacer, wherein the first and second spacer each have a re-entrant profile; a conductive body formed between the first and second spacer; and a void formed within the conductive body.

Example 2: the electromagnetic waveguide of Example 1, wherein the re-entrant profile of the first and second spacers is formed by each spacer having a non-uniform width.

Example 3: the electromagnetic waveguide of Example 1 or Example 2, wherein the first and second spacers have a first width proximate to a bottom portion of the spacer that is larger than a second width proximate to a middle portion of the spacer.

Example 4: the electromagnetic waveguide of Example 3, wherein the first and second spacers have a third width proximate to a top portion of the spacer that is larger than a second width proximate to a middle portion of the spacer.

Example 5: the electromagnetic waveguide of Example 1, Example 2, Example 3, or Example 4, further comprising: a sacrificial layer formed between the conductive body and a substrate on which the electromagnetic waveguide is formed.

Example 6: the electromagnetic waveguide of Example 1, Example 2, Example 3, Example 4, or Example 5, wherein the first spacer and the second spacer are spaced apart by a distance that is approximately 50 nm or less.

Example 7: the electromagnetic waveguide of Example 1, Example 2, Example 3, Example 4, Example 5, or Example 6, further comprising: a cladding layer formed over surfaces of the void.

Example 8: the electromagnetic waveguide of Example 7, wherein the cladding layer is a dielectric layer.

Example 9: the electromagnetic waveguide of Example 7 or Example 8, further comprising: a core formed within the void.

Example 10: the electromagnetic waveguide of Example 1, Example 2, Example 3, Example 4, Example 5, Example 6, Example 7, Example 8, or Example 9, wherein the electromagnetic waveguide includes a splitter or a combiner.

Example 11: a method for forming an electromagnetic waveguide, comprising: forming a dummy gate electrode over a substrate; forming spacers along sidewalls of the dummy gate electrode, wherein the spacers include a reentrant profile; removing the dummy gate electrode; and depositing a conductive body between the spacers with a conformal deposition process, wherein a void is formed within the conductive body during the deposition of the conductive body.

Example 12: the method of Example 11, further comprising: forming a sacrificial layer over the spacers with a non-conformal deposition process, wherein the sacrificial layer reduces the length of an opening between top portions of the spacers.

Example 13: the method of Example 11 or Example 12, wherein the spacers are separated by a distance that is approximately 50 nm or less.

Example 14: the method of Example 11, Example 12, or Example 13, wherein the spacers each have a first width proximate to a bottom portion of the spacer that is greater than a second width that is proximate to a middle portion of the spacer, and wherein the spacers each have a third width proximate to a top portion of the spacer that is larger than the second width of the spacer.

Example 15: the method of Example 11, Example 12, Example 13, or Example 14, further comprising: forming a cladding layer on the surfaces of the void with a conformal deposition process.

Example 16: the method of Example 15, further comprising: forming a core within the void, wherein the core has a lower index of refraction than the cladding layer.

Example 17: an electromagnetic waveguide, comprising: a first spacer; a second spacer; a first portion of a conductive body formed along sidewalls of the first and second spacer and over a substrate on which the electromagnetic waveguide is formed; and a second portion of the conductive body formed between an upper portion of the first portion of the conductive body, wherein the first portion of the conductive body and the second portion of the conductive body define a void through the electromagnetic waveguide.

Example 18: the electromagnetic waveguide of Example 17, wherein a spacing between the first spacer and the second spacer is greater than approximately 50 nm.

Example 19: the electromagnetic waveguide of Example 17 or Example 18, further comprising: a cladding layer formed over surfaces of the void.

Example 20: the electromagnetic waveguide of Example 19, further comprising: a core formed within the void.

Example 21: a method of forming an electromagnetic waveguide, comprising: forming a dummy gate electrode; forming spacers on sidewalls of the dummy gate electrode; removing the dummy gate electrode; depositing a first portion of a conductive body along sidewall surfaces of the spacers and over a top surface of a substrate on which the electromagnetic waveguide is formed with a conformal deposition process; depositing a sacrificial material over the first portion of the conductive body with a non-conformal deposition process; depositing a second portion of a conductive body over the sacrificial material; and removing the sacrificial material to form a void defined by the first portion of the conductive body and the second portion of the conductive body.

Example 22: the method of Example 21, wherein a spacing between the spacers is greater than approximately 50 nm.

Example 23: the method of Example 21 or Example 22, further comprising: forming a cladding layer on the surfaces of the void with a conformal deposition process.

Example 24: the method of Example 23, wherein the cladding layer is doped.

Example 25: the method of Example 23 or Example 24, further comprising: forming a core within the void, wherein the core has a lower index of refraction than the cladding layer.

What is claimed is:

1. An electromagnetic waveguide, comprising:
   a first spacer;
   a second spacer, wherein the first and second spacer each have a re-entrant profile;
   a conductive body formed between the first and second spacer; and
   a void formed within the conductive body.

2. The electromagnetic waveguide of claim 1, wherein the re-entrant profile of the first and second spacers is formed by each spacer having a non-uniform width.

3. The electromagnetic waveguide of claim 2, wherein the first and second spacers have a first width proximate to a bottom portion of the spacer that is larger than a second width proximate to a middle portion of the spacer.

4. The electromagnetic waveguide of claim 3, wherein the first and second spacers have a third width proximate to a top portion of the spacer that is larger than the second width proximate to the middle portion of the spacer.

5. The electromagnetic waveguide of claim 1, further comprising:
   a sacrificial layer formed between the conductive body and a substrate on which the electromagnetic waveguide is formed.

6. The electromagnetic waveguide of claim 1, wherein the first spacer and the second spacer are spaced apart by a distance that is approximately 50 nm or less.

7. The electromagnetic waveguide of claim 1, further comprising:
   a cladding layer formed over surfaces of the void.

8. The electromagnetic waveguide of claim 7, wherein the cladding layer is a dielectric layer.

9. The electromagnetic waveguide of claim 7, further comprising:
   a core formed within the void.

10. The electromagnetic waveguide of claim 1, wherein the electromagnetic waveguide includes a splitter or a combiner.

11. A method for forming an electromagnetic waveguide, comprising:
    forming a dummy gate electrode over a substrate;
    forming spacers along sidewalls of the dummy gate electrode, wherein the spacers include a re-entrant profile;
    removing the dummy gate electrode; and
    depositing a conductive body between the spacers with a conformal deposition process, wherein a void is formed within the conductive body during the deposition of the conductive body.

12. The method of claim 11, further comprising:
    forming a sacrificial layer over the spacers with a non-conformal deposition process, wherein the sacrificial layer reduces the length of an opening between top portions of the spacers.

13. The method of claim 11, wherein the spacers are separated by a distance that is approximately 50 nm or less.

14. The method of claim 11, wherein the spacers each have a first width proximate to a bottom portion of the spacer that is greater than a second width that is proximate to a middle portion of the spacer, and wherein the spacers each have a third width proximate to a top portion of the spacer that is larger than the second width of the spacer.

15. The method of claim 11, further comprising:
forming a cladding layer on the surfaces of the void with a conformal deposition process.

16. The method of claim 15, further comprising:
forming a core within the void, wherein the core has a lower index of refraction than the cladding layer.

17. An electromagnetic waveguide, comprising:
a first spacer;
a second spacer;
a first portion of a conductive body formed along sidewalls of the first and second spacer and over a substrate on which the electromagnetic waveguide is formed; and
a second portion of the conductive body formed between an upper portion of the first portion of the conductive body, wherein the first portion of the conductive body and the second portion of the conductive body define a void through the electromagnetic waveguide.

18. The electromagnetic waveguide of claim 17, wherein a spacing between the first spacer and the second spacer is greater than approximately 50 nm.

19. The electromagnetic waveguide of claim 17, further comprising:
a cladding layer formed over surfaces of the void.

20. The electromagnetic waveguide of claim 19, further comprising:
a core formed within the void.

21. A method of forming an electromagnetic waveguide, comprising:
forming a dummy gate electrode;
forming spacers on sidewalls of the dummy gate electrode;
removing the dummy gate electrode;
depositing a first portion of a conductive body along sidewall surfaces of the spacers and over a top surface of a substrate on which the electromagnetic waveguide is formed with a conformal deposition process;
depositing a sacrificial material over the first portion of the conductive body with a non-conformal deposition process;
depositing a second portion of a conductive body over the sacrificial material; and
removing the sacrificial material to form a void defined by the first portion of the conductive body and the second portion of the conductive body.

22. The method of claim 21, wherein a spacing between the spacers is greater than approximately 50 nm.

23. The method of claim 21, further comprising:
forming a cladding layer on the surfaces of the void with a conformal deposition process.

24. The method of claim 23, wherein the cladding layer is doped.

25. The method of claim 23, further comprising:
forming a core within the void, wherein the core has a lower index of refraction than the cladding layer.

* * * * *